(12) United States Patent
Zhong et al.

(10) Patent No.: US 7,919,859 B2
(45) Date of Patent: Apr. 5, 2011

(54) COPPER DIE BUMPS WITH ELECTROMIGRATION CAP AND PLATED SOLDER

(75) Inventors: Ting Zhong, Tigard, OR (US); Val Dubin, Portland, OR (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 122 days.

(21) Appl. No.: 11/728,082

(22) Filed: Mar. 23, 2007

(65) Prior Publication Data

US 2008/0230896 A1     Sep. 25, 2008

(51) Int. Cl.
   *H01L 23/48* (2006.01)
(52) U.S. Cl. . 257/737; 257/738; 257/772; 257/E23.021; 257/E23.069; 438/613; 438/614
(58) Field of Classification Search .......... 257/737, 257/738, 772, 779, E23.015, E23.02, E23.023–E23.079, 257/E21.508, E21.509, E21.519, E23.021, 257/E23.069; 438/613–617; 228/180.22
See application file for complete search history.

(56) References Cited

U.S. PATENT DOCUMENTS

| | | | |
|---|---|---|---|
| 4,707,418 A * | 11/1987 | Takiar et al. | 428/675 |
| 4,922,322 A | 5/1990 | Mathew | |
| 5,208,186 A | 5/1993 | Mathew | |
| 6,930,389 B2 * | 8/2005 | Huang | 257/737 |
| 7,087,104 B2 | 8/2006 | Choi et al. | |
| 7,122,460 B2 * | 10/2006 | Hua | 438/614 |
| 7,135,770 B2 * | 11/2006 | Nishiyama et al. | 257/734 |
| 7,223,695 B2 | 5/2007 | Zhong et al. | |
| 7,276,801 B2 * | 10/2007 | Dubin et al. | 257/779 |
| 7,391,112 B2 | 6/2008 | Li | |
| 7,416,980 B2 | 8/2008 | Zhong | |
| 2004/0007779 A1 * | 1/2004 | Arbuthnot et al. | 257/780 |
| 2007/0045833 A1 | 3/2007 | Zhong | |
| 2008/0045013 A1 | 2/2008 | Lavoie | |
| 2009/0127710 A1 * | 5/2009 | Daubenspeck et al. | 257/737 |

* cited by examiner

*Primary Examiner* — Jasmine J Clark
(74) *Attorney, Agent, or Firm* — David L. Guglielmi

(57) ABSTRACT

Embodiments of the invention include apparatuses and methods relating to copper die bumps with electtomigration cap and plated solder. In one embodiment, an apparatus comprises an integrated circuit die, a plurality of copper bumps on a surface of the die, electromigration(EM) caps substantially covering a mating surface of the copper bumps capable of controlling intermetallic formation between the cooper bumps and solder, and solder plating on the EM caps capable of protecting the EM caps from oxidation prior to packaging.

15 Claims, 4 Drawing Sheets

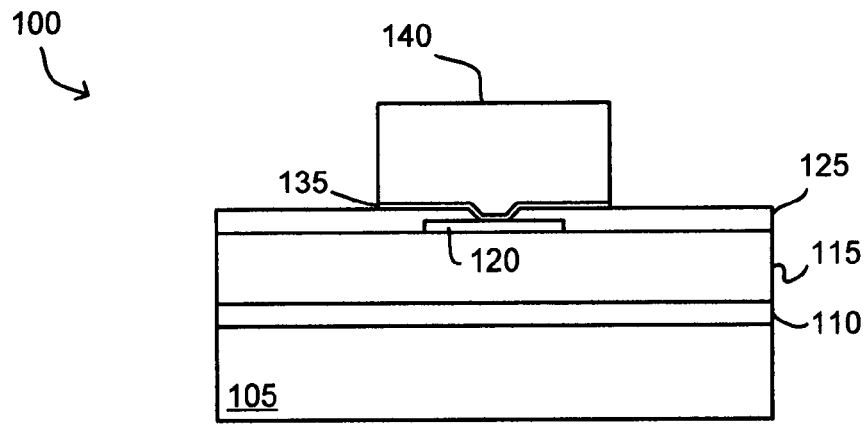
FIG. 1 – Prior Art
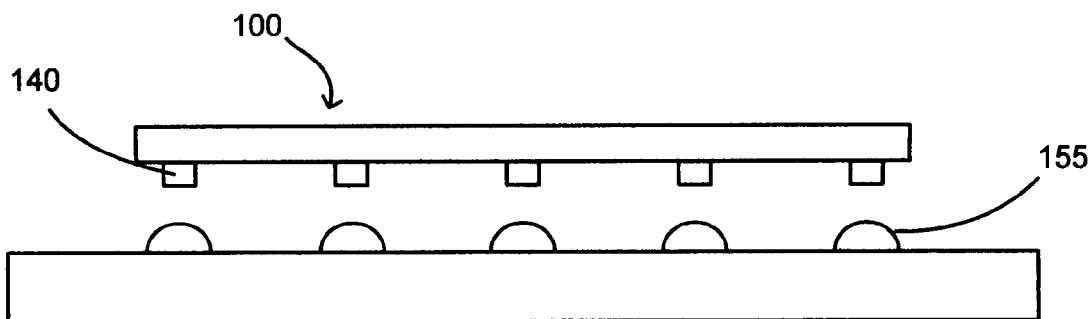
FIG. 2 – Prior Art
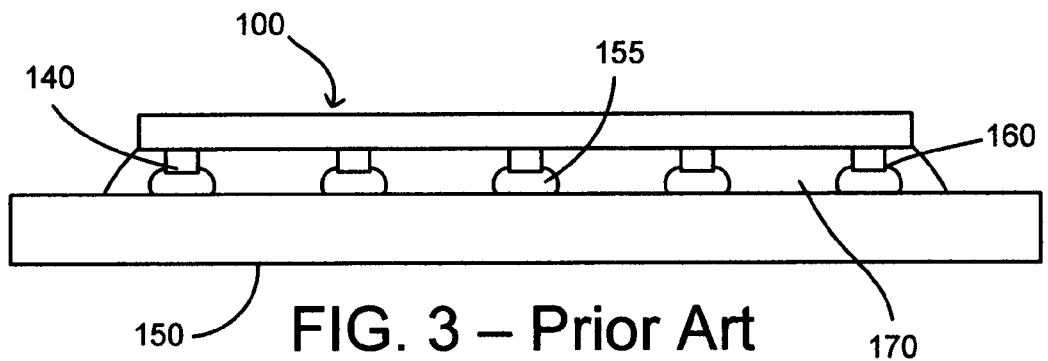
FIG. 3 – Prior Art

US 7,919,859 B2

COPPER DIE BUMPS WITH ELECTROMIGRATION CAP AND PLATED SOLDER

TECHNICAL FIELD

Embodiments of the invention relate to microelectronics packaging technology. In particular, embodiments of the invention relate to microelectronic devices having copper die bumps with electromigration cap and plated solder.

BACKGROUND

After a microelectronic chip or die has been manufactured, it is typically packaged before it is sold. The package provides electrical connection to the chip's internal circuitry, protection from the external environment, and heat dissipation. In one package system, a chip is "flip-chip" connected to a package substrate. In a flip-chip package, electrical leads on the die are distributed on its active surface and the active surface is electrically connected to corresponding leads on a package substrate.

FIGS. 1 through 3 illustrate a prior art method for flip-chip packaging a microelectronic chip or die. In FIG. 1, a portion of a microelectronic die 100 including a conductive bump 140 is illustrated. Microelectronic die 100 includes a substrate 105, a device layer 110, an interconnect region 115, and a land 120. Device layer 110 typically includes a variety of electrical circuit elements, such as transistors, conductors, and resistors, formed in and on a semiconductor substrate material. Interconnect region 115 includes layers of interconnected metal vias and metal lines, which are separated by dielectric materials, that provide electrical connection between the devices of device layer 110 and electrical routing to conductive lands, including land 120. Typically, a dielectric layer 125, a barrier metal 135 and a bump 140 are formed over land 120, with bump 140 providing a structure for electrical connection from die 100 to an external package substrate.

As shown in FIGS. 2 and 3, in a common flip-chip package system, microelectronic die 100 is turned over, or flipped, and bonded to a package substrate 150 such that its active surface, including bumps 140, faces a surface of package substrate 150. Bumps 140 are in alignment with solder bumps or balls 155 on the surface of package substrate 150, and electrical connections are formed between bumps 140 and balls 155 at joints 160. As shown, joints 160 typically include portions of bumps 140 being depressed into the solder bumps. Also illustrated in FIG. 3 is an underfill material 170 that is provided between die 100 and package substrate 150.

In some processes, the bumps 140 are copper. In such systems, the joints 160 may develop voids between bumps 140 and the solder balls 155. The growth of these voids, due to electromigration of copper can lead to many problems. For example, it may cause an increase in electrical resistance, leading potentially to broken interconnects and device failure.

BRIEF DESCRIPTION OF THE DRAWINGS

The invention is illustrated by way of example and not by way of limitation in the figures of the accompanying drawings, in which the like references indicate similar elements and in which:

FIG. 1 is a cross-sectional illustration of a portion of a prior art microelectronic die, including a substrate, a device layer, an interconnect region, a land, a dielectric layer exposing a portion of the land, and a barrier metal and bump coupled to the land.

FIG. 2 is a cross-sectional illustration of a prior art flip-chip structure, including a die having bumps aligned to a package substrate having solder bumps.

FIG. 3 illustrates the structure of FIG. 2 after attachment of the die and the package substrate, and including an underfill material.

DETAILED DESCRIPTION

In various embodiments, apparatuses and methods relating to copper die bumps with electromigration cap and plated solder are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without the specific details described. Furthermore, it is understood that the various embodiments shown in the figures are illustrative representations and are not necessarily drawn to scale.

FIGS. 4-12 illustrate methods and structures for a flip-chip package system having copper die bumps with electromigration cap and plated solder.

Figure 4:
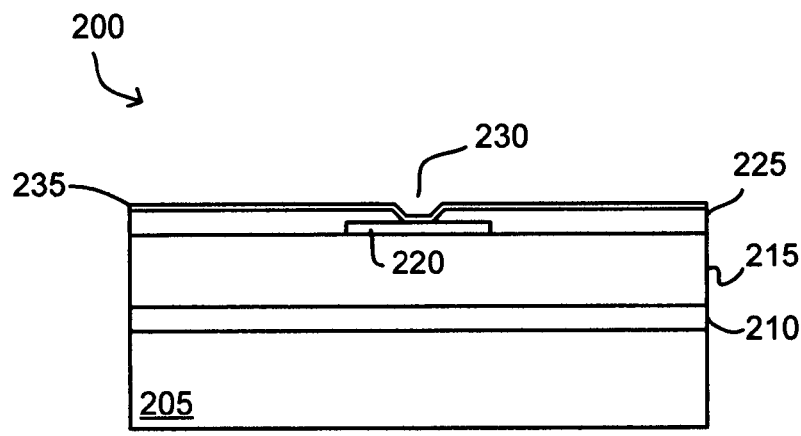
FIG. 4 is a cross-sectional illustration of a portion of a microelectronic die, including a substrate, a device layer, an interconnect region, a land, a dielectric layer over the land and including an opening that exposes a portion of the land, and a seed layer formed over the dielectric layer and the land.

FIG. 4 illustrates a portion of a microelectronic die 200 including a substrate 205, a device layer 210, an interconnect region 215, a land 220, a dielectric layer 225 having an opening 230 exposing a portion of land 220, and a seed layer 235 over dielectric layer 225 and the exposed portion of land 220, partially filling opening 230.

In general, the die may be part of a wafer having a plurality of dice or the die may be an individual and separate integrated circuit. Substrate 205 includes any suitable semiconductive material or materials for the formation of operative devices. For example, substrate 205 may include monocrystalline silicon, germanium, gallium arsenide, indium phosphide, or silicon on insulator, or the like. Device layer 210 includes devices formed in and on substrate 205, such as transistors, resistors, or conductors that form an integrated circuit.

Interconnect region 215 provides electrical interconnection for the devices of device layer 210. Interconnect region 215 includes a stack of metallization layers which include metal lines that are separated and insulated by interlayer dielectric (ILD) materials. The metal lines of the metallization layer are interconnected by conductive vias which are also separated and insulated by dielectric materials. The ILD materials include any suitable insulative materials, including low-k ILD materials, which have a dielectric constant, k, of less than that of silicon dioxide (less than about 4). Low-k ILD materials are advantageous because they reduce the capacitance between adjacent metal lines and thereby improve the performance of the overall microelectronic device, for example by reducing RC delay. However, many low-k ILD materials are relatively brittle and susceptible to cracking or delamination. Therefore, the following methods and structures may enable the use or increase the reliability of some low-k ILD materials by reducing stresses on those materials.

Land 220 is electrically connected to one or more of the metal lines and vias of interconnect region 215 and provides a conductive land or pad for the subsequent formation of an electrical lead or bump. In some examples, land 220 may be considered a part of interconnect region 215, such as a top metallization layer of interconnect region 215. In other examples, land 220 is formed over interconnect region 215. Land 220 includes any suitable conductive material, such as copper or aluminum. Dielectric layer 225 is formed over (as shown) or around land 220 and includes any suitable insulative material, such as a passivation materials or insulative materials. To form dielectric layer 225 having opening 230, a bulk dielectric layer is first formed by a spin-on method or other suitable deposition method. Then, opening 230 is formed in dielectric material 225 by known techniques, such as photolithography and etches techniques.

Seed layer 235 includes any suitable material or stack of materials that provides a suitable seed for the formation of a bulk conductor material, as is discussed in FIG. 6 below. For example, for the formation of a bulk copper conductor, a copper seed layer is used. Prior to the formation of seed layer 235, a barrier or adhesion layer may be provided. The barrier layer may include tantalum and tantalum nitride or titanium and titanium nitride, for example. The barrier layer and the seed layer are formed by known techniques, such as atomic layer deposition (ALD), physical vapor deposition (PVD), and chemical vapor deposition (CVD).

Figure 5:
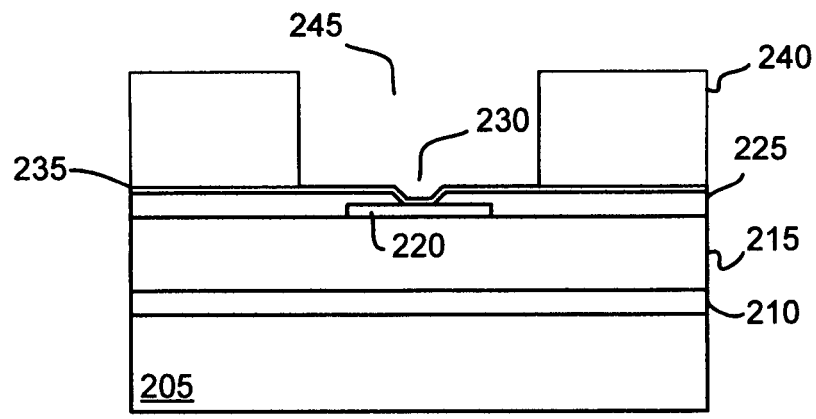
FIG. 5 illustrates the structure of FIG. 4 with a layer including an opening formed over the seed layer.

Next, a layer 240 including an opening 245 is formed over seed layer 235, such that the land is exposed, as is illustrated in FIG. 5. Herein, the term "over" refers to the surface that is away from the substrate, such that the substrate is used as the frame of reference and subsequent structures are built "up" upon the substrate. Therefore, use of terms such as bottom, top, over, and side are with reference to the substrate as being toward the bottom of the structure, and not referring to "up" or "down" in reference to the ground or any other frame of reference.

Layer 240 includes any suitable material that facilitates the formation of an opening 245 and provides sufficient structure for the subsequent formation of a bump, as is discussed below. For example, layer 240 may include a negative photoresist and opening 245 may be formed by photolithography processing.

Figure 6:
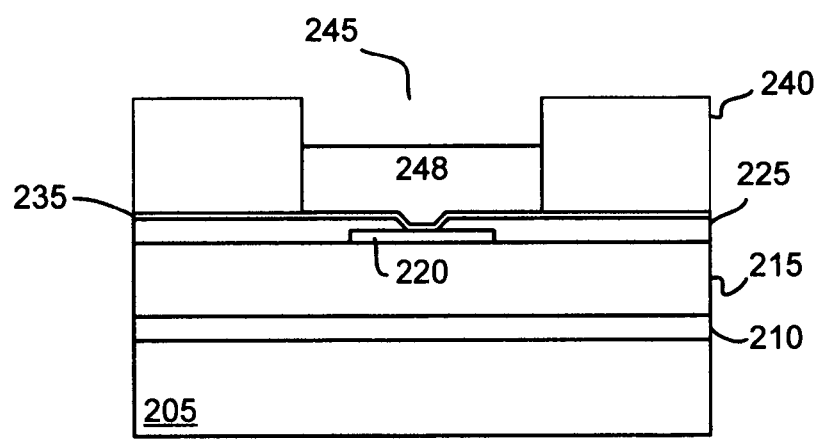
FIG. 6 illustrates the structure of FIG. 5 with a bump formed in the opening and on the seed layer.

As illustrated in FIG. 6, a bump 248 is then formed within the confines of the opening 245. Bump 248 includes any suitable conductive material, such as copper, and bump 248 may be formed by any suitable technique. In one example, bump 248 is formed by a timed electroplating method using seed layer 235. Bump 248 substantially takes the form of the opening in layer 240. In one example, the opening has a round shape as viewed from the top down. In one embodiment, bump 248 is a controlled collapse chip connection (C4) bump.

Figure 7:
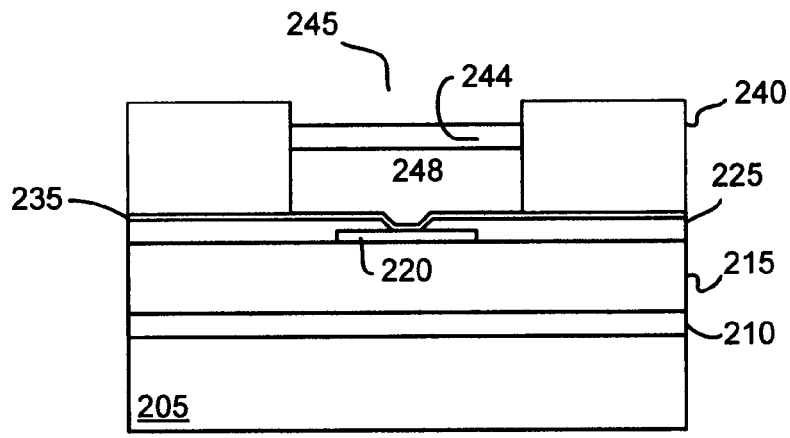
FIG. 7 illustrates the structure of FIG. 6 with a cap formed in the opening and on the bump.

Next, capping layer 244 is formed on bump 248 in opening 245, as illustrated in FIG. 7. Capping layer 244 comprises a metal, such as iron, nickel, cobalt, tin, palladium or platinum, capable of controlling electromigration of bump 248 with a package solder ball. In one embodiment, capping layer 244 is about 6 micrometers thick. Capping layer 244 may be formed by electroplating or electroless plating.

Figure 8:
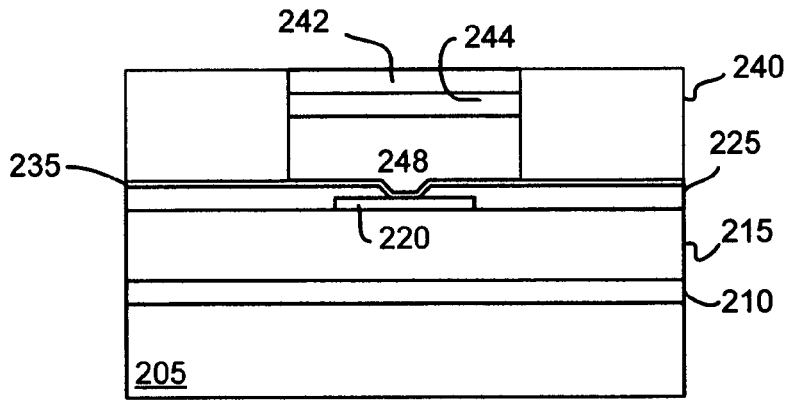
FIG. 8 illustrates the structure of FIG. 7 with a plating formed in the opening and on the cap.

As illustrated in FIG. 8, solder layer 242 is formed on capping layer 244 in opening 245. Solder layer 242 comprises a tin or tin alloy solder capable of substantially preventing oxidation of capping layer 244 during subsequent processing steps prior to packaging. In one embodiment, solder layer 242 is about 2 micrometers thick. Solder layer 242 may be formed by electroplating or electroless plating.

Figure 9:
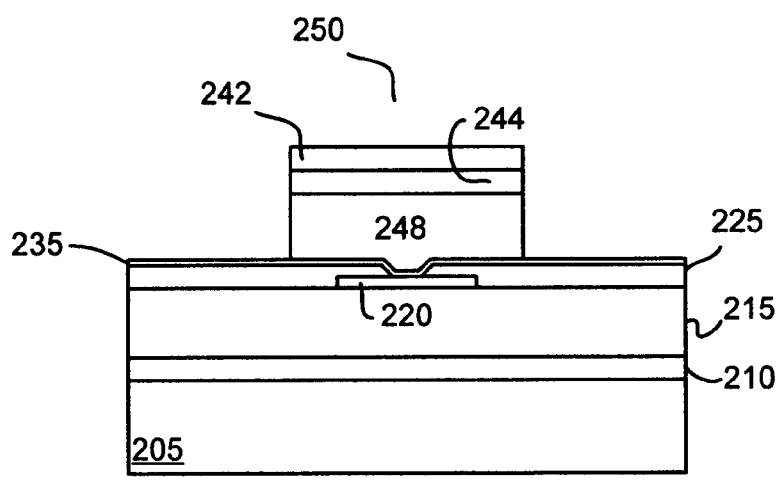
FIG. 9 illustrates the structure of FIG. 8 with the layer removed.
Figure 10:
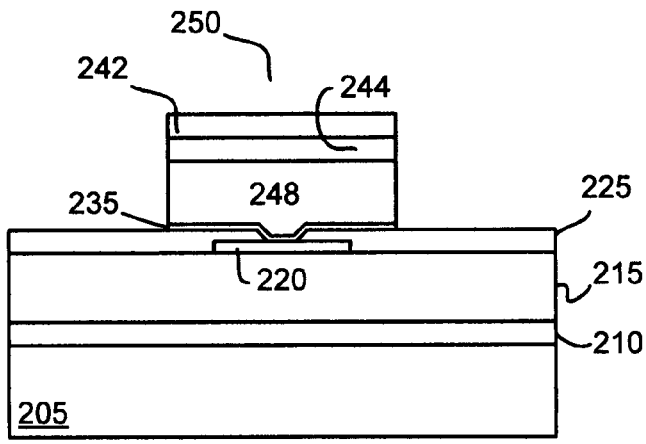
FIG. 10 illustrates the structure of FIG. 9 with exposed portions of the seed layer removed.

Layer 240 is then removed, as is shown in FIG. 9, exposing covered bump 250. Layer 240 is removed by any suitable technique, such as a wet etch process, dry etch process, or a resist strip process. Next, as is illustrated in FIG. 10, the portion of seed layer 235 that is exposed (i.e., not covered by the tapered bump) is removed by any suitable technique. For example, the portion of seed layer 235 may be removed by a wet etch processing step. A wet etch processing step may also remove a small portion of bump 248 if the bump and the seed layer are the same material or if there is little or no etch selectivity between the two materials. Since only a small portion of the bump is removed, there will be little or no adverse effect to the shape of the bump. In order to remove the majority of the seed layer and only a small amount of the bump, a timed wet etch step may be used.

Figure 11:
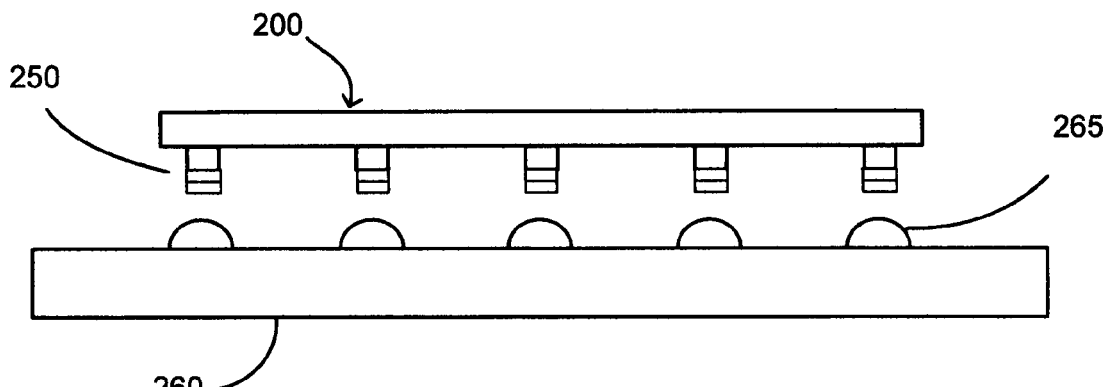
FIG. 11 is a cross-sectional illustration of a microelectronic die including tapered bumps aligned to a substrate having solder bumps for flip-chip attachment.
Figure 12:
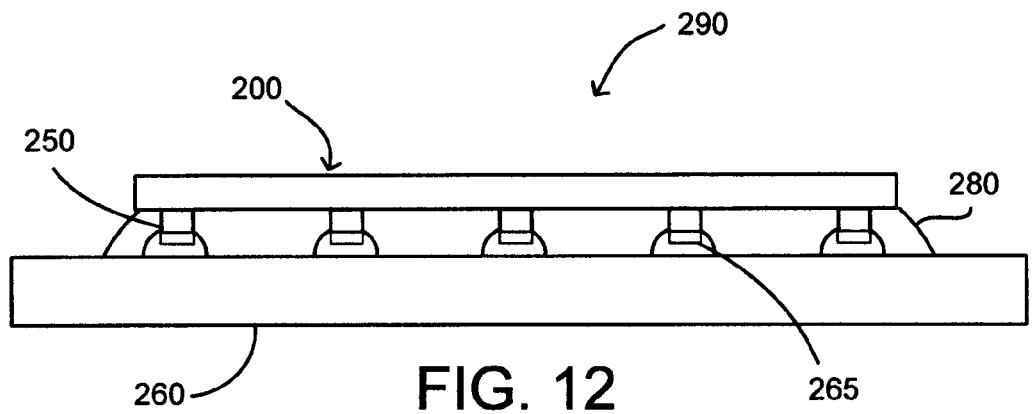
FIG. 12 illustrates the structure of FIG. 11 after attachment of the die and the package substrate, and including an underfill material.

As illustrated in FIGS. 11-12, microelectronic die 200, including covered bumps 250, may be flip-chip attached to a substrate 260 including solder bumps 265. In FIGS. 11-12, several elements illustrated in FIGS. 4-10 are not illustrated for the sake of clarity. In some examples, covered bumps 250 are formed at the end of wafer processing on a number of microelectronic dice and the attachment of die 200 to substrate 260 is made after dicing substrate 205 to separate the multiple integrated circuits into discrete die.

Substrate 260 includes any suitable packaging substrate, such as a printed circuit board (PCB), interposer, motherboard, card, or the like. Solder bumps 265 are any suitable solder material, including lead-based solders or lead-free solders. Example lead-free solders include alloys of tin and silver or alloys of tin and indium. Lead free solders may be advantageous due to environmental and health concerns related to the use of lead in consumer products.

As shown in FIG. 11, microelectronic die 200 and substrate 260 are positioned such that covered bumps 250 and respective solder bumps 265 are substantially aligned, and the die and the substrate are brought together at an elevated temperature such that the solder reflows and, upon cooling, form joints with covered bumps 250 to electrically couple die 200 and substrate 260, as is shown in FIG. 12. Also, as illustrated in FIG. 12, an underfill material 280 is formed between die 200 and substrate 260. In one example, underfill material 280 is provided by a capillary underfill process. Die package 290 may then be assembled into a computing device, such as a desktop, laptop, server, PDA, cell phone, etc., which may include a memory device and a network controller.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. An apparatus comprising:
   an integrated circuit die;
   a plurality of copper bumps on a surface of the die;
   electromigration (EM) caps substantially covering a mating surface of the copper bumps capable of controlling intermetallic formation between the copper bumps and a solder after a solder reflow, wherein the EM caps have a thickness of about 6 micrometers ; and
   solder plating on the EM caps capable of protecting the EM caps from oxidation prior to packaging, wherein the solder plating has a thickness of about 2 micrometers.

2. The apparatus of claim 1, wherein the EM caps comprise iron.

3. The apparatus of claim 1, wherein the EM caps comprise cobalt.

4. The apparatus of claim 1, wherein the EM caps comprise a metal chosen from the group consisting of: tin, nickel, palladium, and platinum.

5. The apparatus of claim 1, wherein the solder plating comprises tin based solder.

6. The apparatus of claim 1, further comprising an integrated circuit package soldered to the die.

7. The apparatus of claim 6, further comprising:
   a memory; and
   a network controller.

8. A method comprising:
   forming copper bumps on a surface of an integrated circuit wafer;
   forming an electromigration capping layer on a surface of the copper bumps capable of controlling intermetallic formation between the copper bumps and a solder after a solder reflow, wherein forming the capping layer comprises electroplating iron; and
   forming a solder layer on a surface of the capping layer.

9. The method of claim 8, further comprising removing a photo-resist material.

10. The method of claim 9, wherein forming the solder layer comprises electroplating tin alloy solder.

11. The method of claim 9, wherein forming the solder layer comprises electroless plating tin alloy solder.

12. The method of claim 9, further comprising removing a base metal layer.

13. The method of claim 9, further comprising dicing the wafer.

14. he method of claim 13, further comprising soldering a die from the wafer to a package.

15. The method of claim 14, further comprising inserting the die package into a computing device.

* * * * *